(12) United States Patent
Furukawa et al.

(10) Patent No.: US 7,771,604 B2
(45) Date of Patent: Aug. 10, 2010

(54) REDUCED MASK COUNT GATE CONDUCTOR DEFINITION

(75) Inventors: Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 1065 days.

(21) Appl. No.: 10/711,758

(22) Filed: Oct. 4, 2004

(65) Prior Publication Data
US 2006/0073394 A1    Apr. 6, 2006

(51) Int. Cl.
*B44C 1/22* (2006.01)
*C03C 15/00* (2006.01)
*C03C 25/68* (2006.01)
*C23F 1/00* (2006.01)

(52) U.S. Cl. .............. 216/58; 216/52; 216/57; 216/59; 430/5; 430/313; 430/322; 430/323; 430/324; 438/671; 438/694; 438/597; 438/654; 716/19

(58) Field of Classification Search ............... 216/58, 216/52, 57, 59; 430/5, 313, 322, 323, 324; 438/671, 694, 597, 654; 716/19
See application file for complete search history.

(56) References Cited

U.S. PATENT DOCUMENTS

| | | | |
|---|---|---|---|
| 4,358,748 A * | 11/1982 | Gruner et al. ............. | 338/25 |
| 5,795,830 A | 8/1998 | Cronin et al. | |
| 6,632,741 B1 | 10/2003 | Clevenger et al. | |
| 6,875,703 B1 | 4/2005 | Furukawa et al. | |
| 2003/0193058 A1 | 10/2003 | Fried et al. | |
| 2003/0193065 A1 | 10/2003 | Fried et al. | |
| 2003/0197194 A1 | 10/2003 | Fried et al. | |
| 2005/0106837 A1* | 5/2005 | Nakai et al. ............. | 438/427 |
| 2006/0084243 A1 | 4/2006 | Zhang et al. | |

OTHER PUBLICATIONS

M.L. Kerbaugh, et al. "A Method of Sidewall Image Transfer Utilizing the Polymide-Nitride Material Interaction", Research Disclosure, Feb. 1988, No. 286.

(Continued)

*Primary Examiner*—Parviz Hassanzadeh
*Assistant Examiner*—Mahmoud Dahimene
(74) *Attorney, Agent, or Firm*—David Cain; Roberts Mlotkowski Safran & Cole, P.C.

(57) ABSTRACT

A combined wide-image and loop-cutter pattern is provided for both cutting and forming a wide-image section to a hard mask on a substrate formed by sidewall imaging techniques in a reduced number of photolithographic steps. A single mask is formed which provides a wide mask section while additionally providing a mask to protect the critical edges of an underlying hard mask during hard mask etching. After the hard mask is cut into sections, the protective portions of the follow-on mask are removed to expose the critical edges of the underlying hard mask while maintaining shapes necessary for defining wide-image sections. Thus, the hard mask cutting, hard mask critical edge protecting, and large area mask may be formed in a reduced number of steps.

19 Claims, 16 Drawing Sheets

OTHER PUBLICATIONS

Anonymous, "Process and Mask Structure for Submicrometer-wide Polysilicon or Polycide Emitters", Feb. 1987. Research Disclosure Database No. 274061, Research Disclosure Journal No. 27461.

J.E. Cronin, "Method for Making a Single Sidewall Structure", IBM Technical Disclosure Bulletin, vol. 30, No. 12, May 1988, pp. 157-158.

* cited by examiner though hard masks. Thus, instead of the traditional wet—to the follow-on mask to pattern wide-area shapes under the hard mask and follow-on mask.

REDUCED MASK COUNT GATE CONDUCTOR DEFINITION

FIELD OF THE INVENTION

The invention relates to semiconductor fabrication, and more particularly to fabricating a combination of small and large structures.

BACKGROUND DESCRIPTION

As the size of semiconductor devices has decreased, photolithographic techniques become unable to reliably create structures of the dimensions required. As photolithographic techniques have become unusable, other technologies have been developed to create the small structures required by the ever shrinking semiconductor devices. One example of a non-photolithographic imaging technique is sidewall image transfer ("SIT").

SIT is able to produce structures substantially narrower than the minimum size achievable with photolithographic techniques, while maintaining excellent width control. However, SIT methods produce structures, usually hard masks, of generally closed-loop geometry. These loops have a single, well-controlled width (referred to henceforth as the "critical image width"). Conventional SIT applications thus require the use of two additional masks. One, called a "loop cutter mask", is employed to segment the loops, and a second, called a wide-area mask, is employed to add shapes of any other, usually wider, dimensions.

Accordingly, subsequent processing is required to remove the unwanted portions of the closed-loop structures produced by SIT. While removing unwanted loop material with the loop-cutter mask, both edges of loop material which define portions of critical width images must be protected in order to maintain the excellent image size control afforded by SIT techniques. Both of these edges must subsequently be left exposed during etch of underlying films in order to accurately transfer their pattern into those underlying films.

Furthermore, not all structures being formed are to be of the same small dimensions typically produced by SIT methods. Wider shapes are often required, for example, to fabricate contact landing pads.

Combining other imaging processes with SIT methods to produce structures of varying dimensions, with some of those dimensions smaller than those achievable by photolithographic techniques, is typically required.

SUMMARY OF THE INVENTION

In a first aspect of the invention, a method of combining the wide-image mask and loop-cutter mask includes protecting a critical portion of a loop-geometry hard mask on a substrate with a first portion of a follow-on mask, and forming a widearea pattern on the substrate proximate the hard mask with a second portion of the follow-on mask. The method also includes removing an exposed portion of the hard mask, and subsequently exposing the critical portion of the hard mask.

In another aspect of the invention, a method of combining a wide-image mask and a loop-cutter mask includes forming a follow-on mask in a loop-cutter pattern on a portion of a hard mask, wherein the follow-on mask comprises a wideimage section and narrow-image section, and removing a portion of the hard mask left exposed by the follow-on mask. The method also includes removing at least a portion of the narrow-image section of the follow-on mask. The method also includes employing remaining wide-image sections of the follow-on mask to pattern wide-area shapes under the hard mask and follow-on mask.

In another aspect of the invention, a combined wide-image and loop cutter mask includes a follow-on mask formed over a hard mask, and a wide-image section forming a first portion of the follow-on mask. A narrow-image section forms a second portion of the follow-on mask. The follow-on mask is configured to have the narrow-image section preferentially removed while the wide-image section remains substantially able to mask underlying films.

DETAILED DESCRIPTION OF EMBODIMENTS OF THE INVENTION

The invention relates to semiconductor fabrication, and more particularly to fabricating a combination of small and large structures. In embodiments of the invention, a reduction in the number of masks required to form a final image especially when combining SIT imaging processes with traditional masking techniques is possible. In one embodiment, the method of the invention generally includes, for example, forming a follow-on mask over a section of a sidewall image transfer (SIT) loop on a substrate for further imaging the underlying substrate. The follow-on mask enables cutting the loop into segments and adds larger features to the image formed by the SIT loop, without interfering with the accuracy for those portions of the final image formed by the SIT loop.

Figure 1:
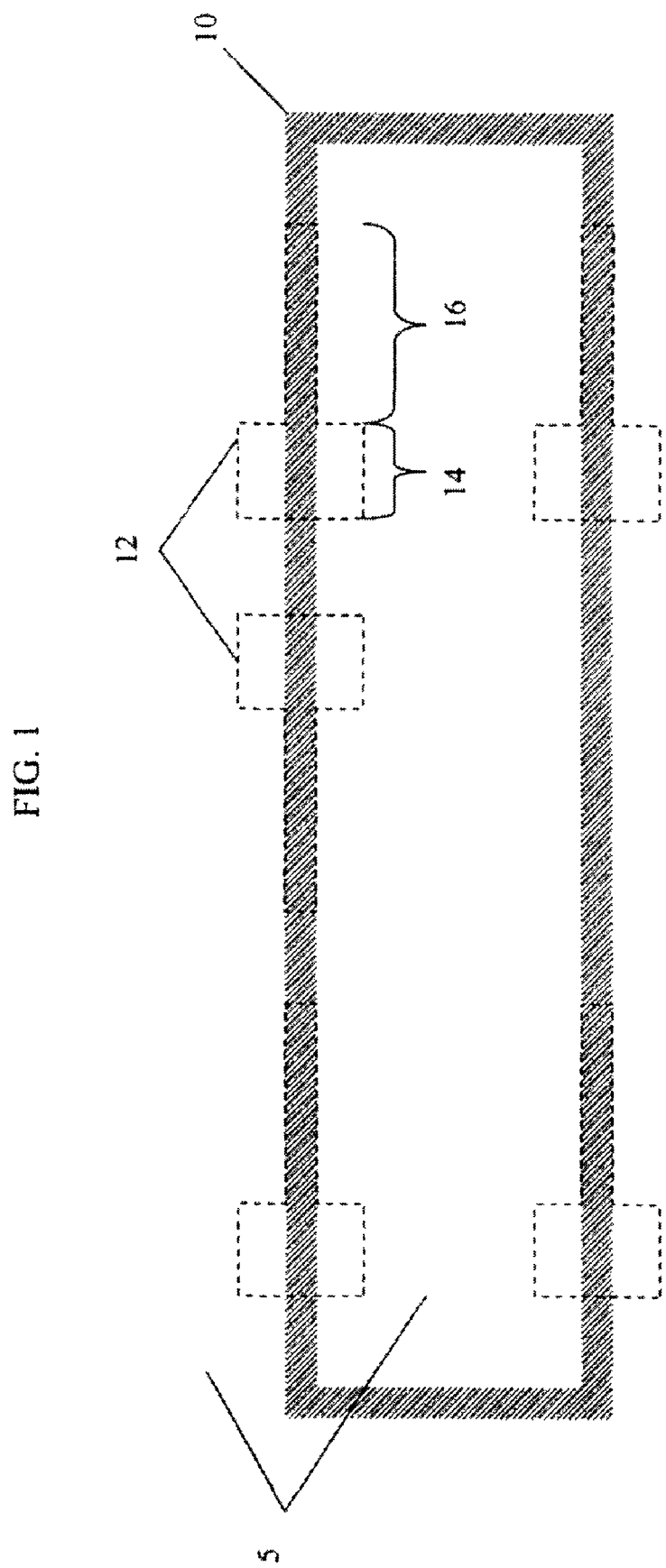
FIG. 1 is an illustration of a SIT hard mask before trimming.

Referring to FIG. 1, a hard mask 10 image in the form of a SIT loop built using SIT-related techniques is shown. Although a hard mask loop 10 is shown, any imaging technique which builds a continuous, single-width loop, especially a single-width loop of very small and precise width, is suitable for use with embodiments of the invention. Typically, the SIT loop or hard mask 10 is on the order of a few tens of nanometers wide. However, embodiments of the invention are suitable for use with loops, or any hard mask image of virtually any size suitable for use in a semiconductor device. Also shown in FIG. 1 are dashed lines indicating the target shape 12 of the final image.

The target shape 12 is the final shape to which the underlying substrate will be formed using the hard mask loop 10 and a follow-on mask. The target shape 12 includes a wide section 14 and a narrow section 16. The wide section 14 of the target shape 12 overlaps the hard mask loop 10; whereas, the narrow section 16 of the target shape 12 coincides with a portion of the hard mask loop 10.

In accordance with the invention, after forming the hard mask loop 10, it may be necessary to cut the loop into sections plus define wide pads for contact formation. The techniques of example embodiments, as described, follow loop definition by printing of a single follow-on mask. In general, the follow-on mask should protect 1) desired portions of the SIT-defined critical-dimension masking loop; and 2) less-critical, usually wider regions to be used, for example, for long-channel devices or contact pads. Portions of loop to be removed should be left uncovered. After etch/removal of unwanted loop material, removal of the part of the follow-on mask covering critical-dimension SIT-defined lines is desirable.

Figure 2:
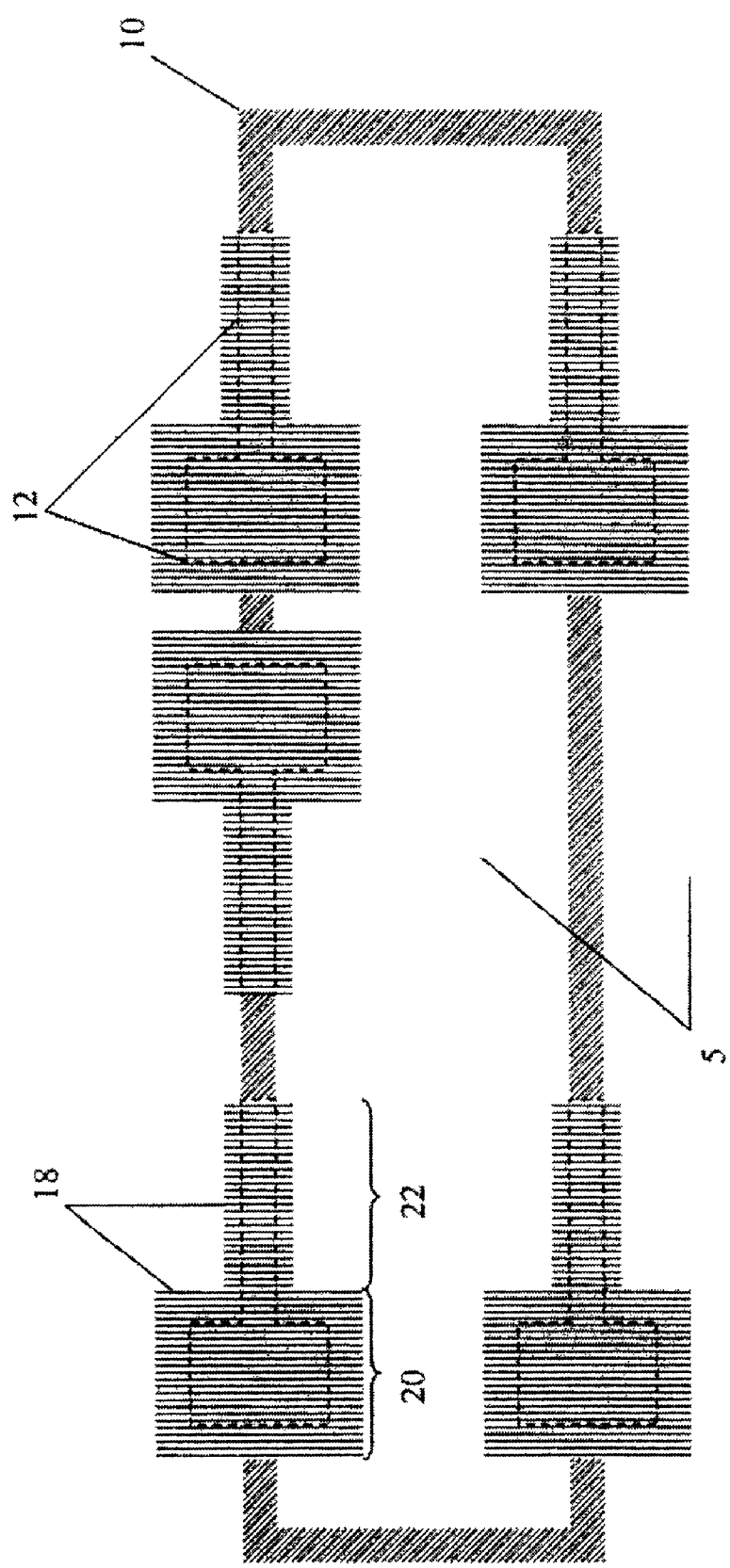
FIGS. 2-5 illustrates steps in an embodiment of forming a wide-image and loop-cutter pattern in accordance with the invention.

Referring to FIG. 2, a follow-on mask 18 is formed over a portion of the hard mask loop 10. The follow-on mask 18 includes a wide section 20, which corresponds to the wide section 14 of the target shape 12. The follow-on mask 18 also includes a narrow section 22 which corresponds to the narrow section 16 of the target shape 12. The follow-on mask 18 may be formed by any of the methods well know in the art suitable for forming a follow-on mask over a hard mask loop including, expanding a desired wide-feature design by an undercut/ashback amount, and adding tabs to cover desired portions of the hard mask loop 10.

In other words, after forming a hard mask loop 10 using SIT, the process includes printing a single follow-on mask 18. The patterns for mask 18 are created by expanding desired wide-poly designs by an undercut/ashback amount, and adding tabs to cover desired SIT-defined width regions. This produces a single gate-conductor follow-on mask which is a combined wide-image and loop-cutter pattern.

Figure 3:
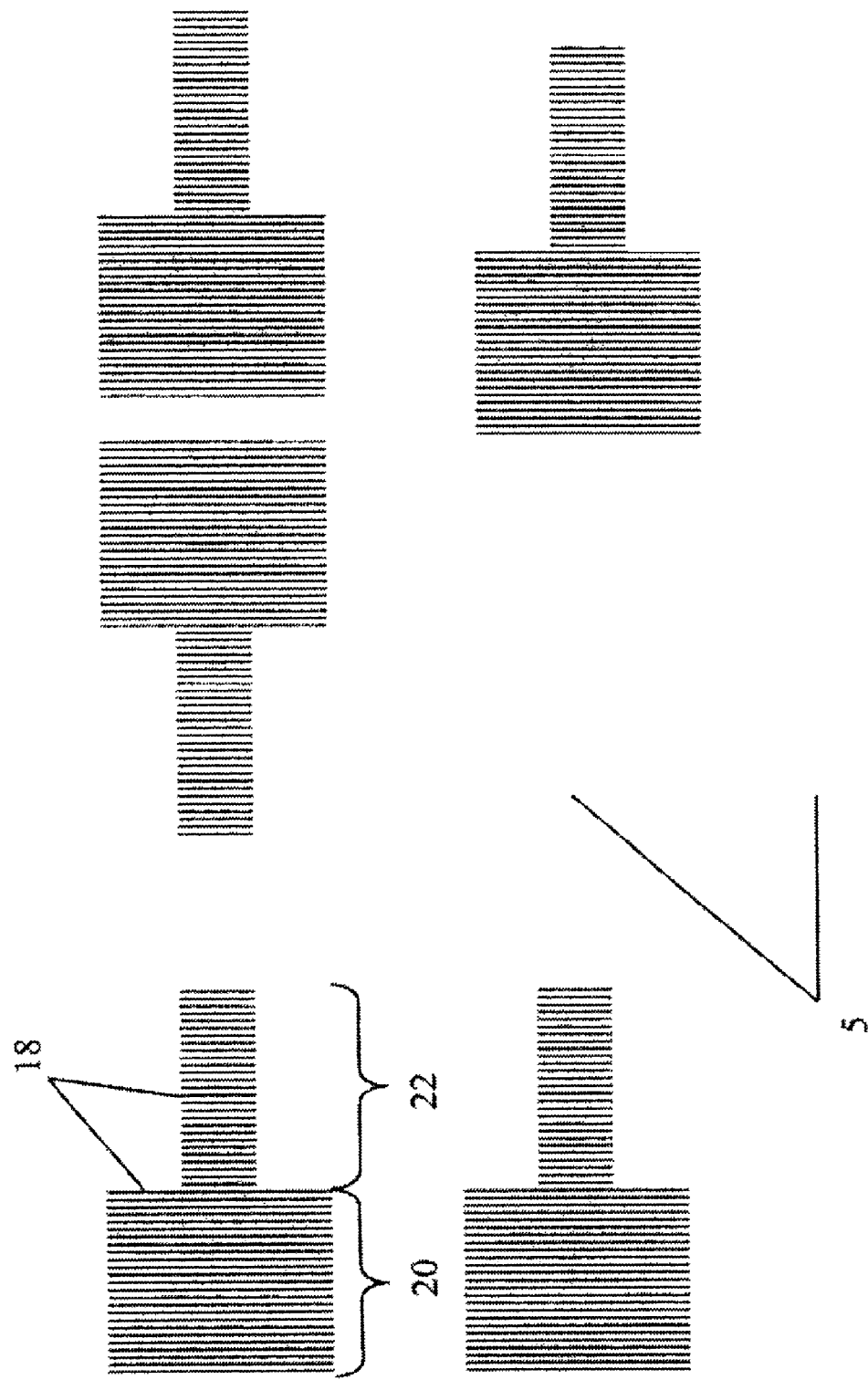

Referring to FIG. 3, after the follow-on mask 18 has been formed, the unwanted, uncovered regions of the hard mask loop loop 10 are etched away from the substrate 5. The unwanted sections of the hard mask 10 may be removed using any of the suitable etching techniques well known in the art for removing the hard mask material. In other words, unwanted SIT-defined hard mask loop portions are removed/etched, without stripping resist.

Figure 4:
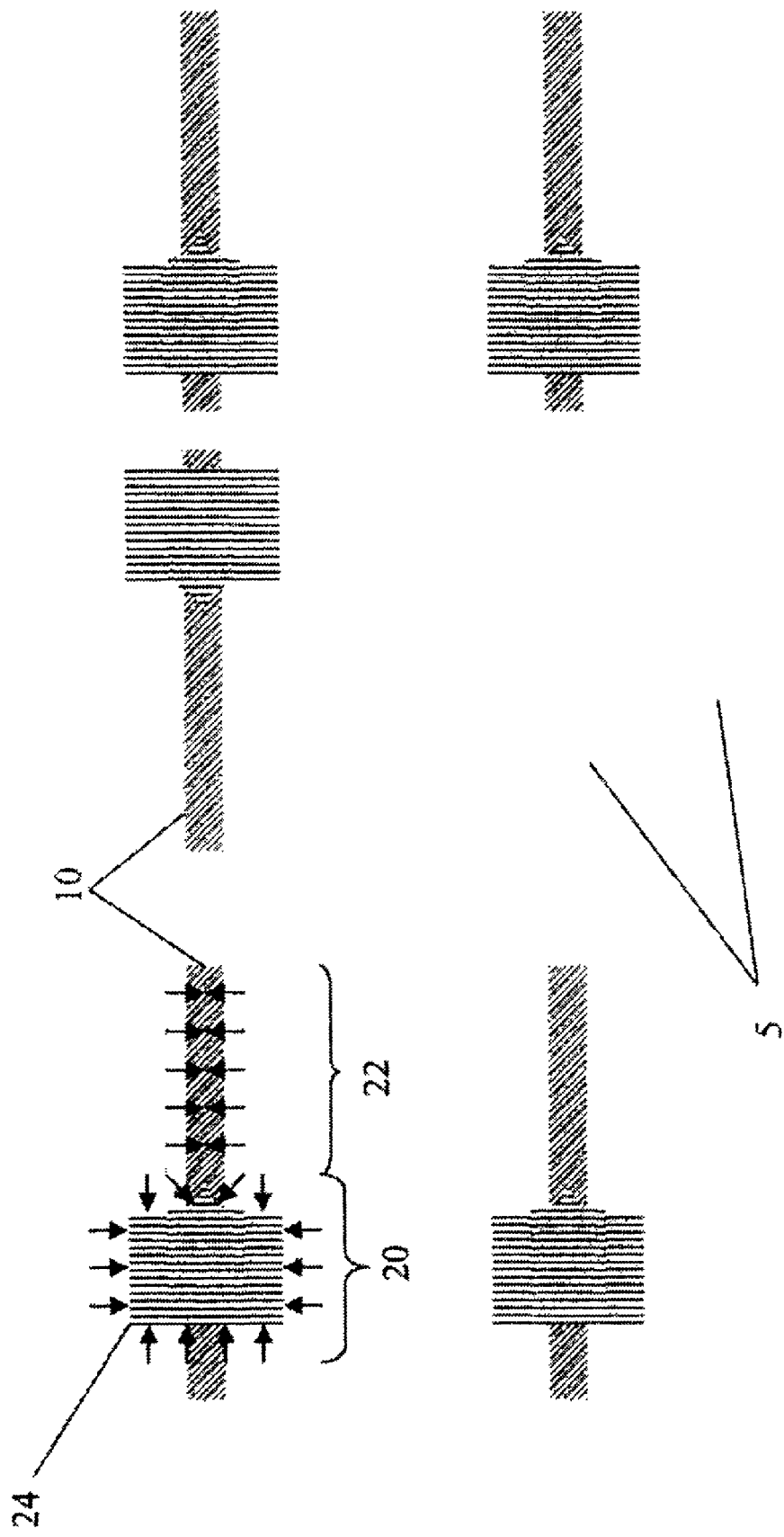

Referring to FIG. 4, the follow-on mask 18 (see FIG. 3) is etched in such a way as to reduce its length and width along its edges. Accordingly, in some instances, the narrow section 22 of the follow-on mask 18 will be almost completely etched away. The narrow section 22 of the follow-on mask 18 is at least etched away sufficiently to expose the underlying critical edges of the hard mask loop 10. In other words, the process includes pulling back the follow-on mask 18 so that the narrow section 22 covering desired portions of the hard mask loop 10 are removed (at least the critical edges of the SIT line are uncovered).

In the example of FIG. 4, the narrow section 22 of the follow-on mask 18 has been completely removed to expose the underlying remaining hard mask loop 10 section. Additionally, the wide section 20 of the follow-on mask 18 has its length and width reduced to produce an image pad 24. The image pad 24 substantially conforms to the wide area 14 of the target shape 12. Additionally, the remaining exposed portion of the hard mask loop 10, formerly covered by the narrow section 22 of the follow-on mask 18 corresponds to the narrow section 16 of the target shape 12.

As noted above, the etching of the follow-on mask 18 to form the image pad 24 may be performed by any of the methods well known in the art suitable for etching a follow-on mask on top of a hard mask loop 10 section and substrate 5.

Figure 5:
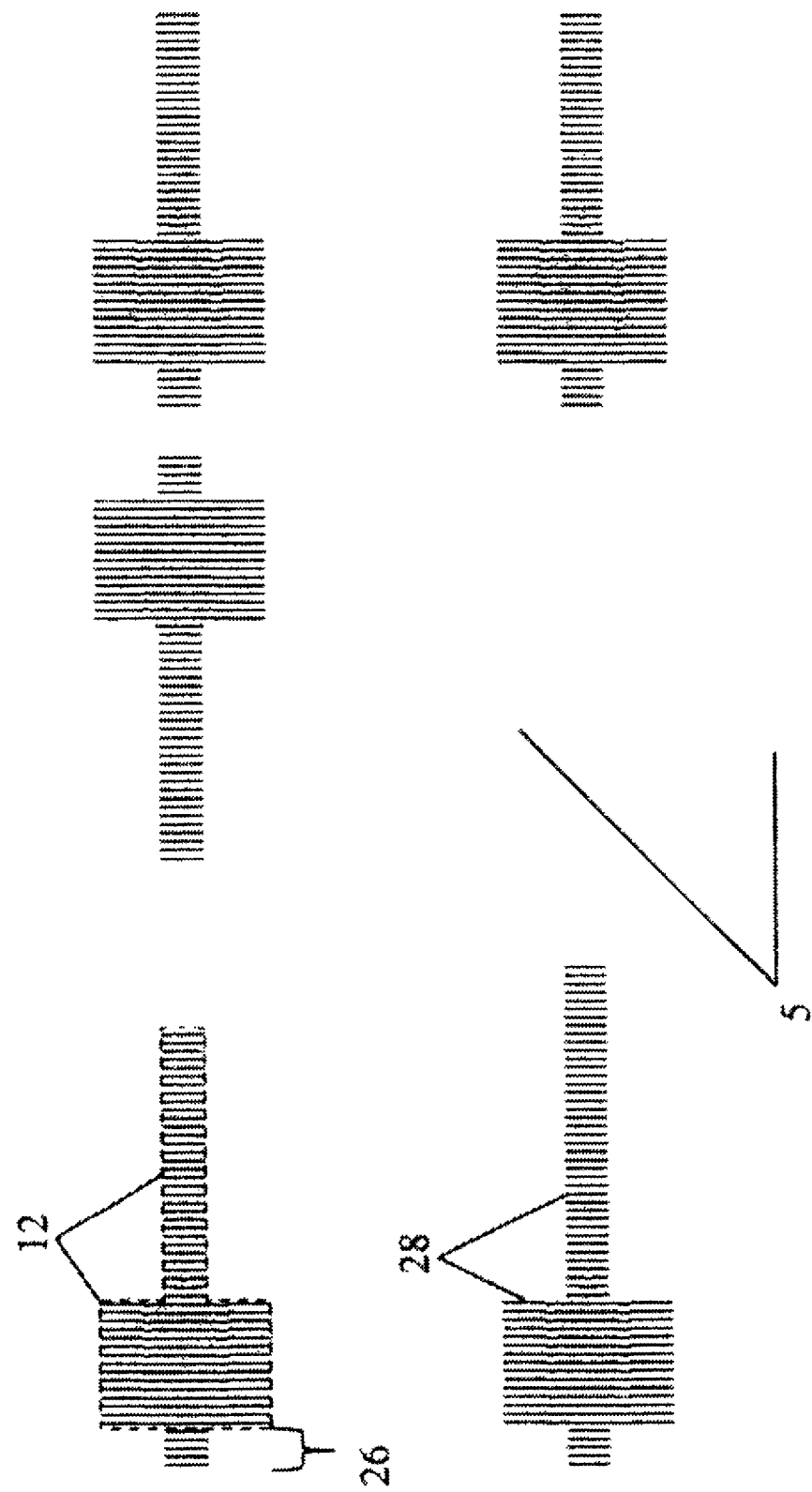

Referring to FIG. 5 and comparing with FIG. 4, once the combination of the image pad 24 and the remaining hard mask loop 10 section are formed, the structure is used as a mask for etching the underlying substrate 5. Accordingly, once the underlying substrate 5 has been etched, a structure of the underlying substrate 5 in the shape of the target shape 12 is formed where a portion of the final structure is shaped using the critical edges of the hard mask. In one embodiment, this includes etching the gate conductor stack using a combination of SIT-loop for the device-Lpoly section, plus resist pad for the wide section, and then stripping masking layers.

The final shape of the underlying substrate 5 may additionally include a stub 26 in addition to the target shape 12. The stub 26 is a consequence of the pull-back process of the wide area 20 of the follow-on mask 18 exposing additional portions of hard mask loop 10. In most applications, this stub 26 is an inconsequential artifact which has no effect on fabrication process or the circuit design. In other applications, the stub 26 may be a beneficial component to the final shape 28.

Figure 6:
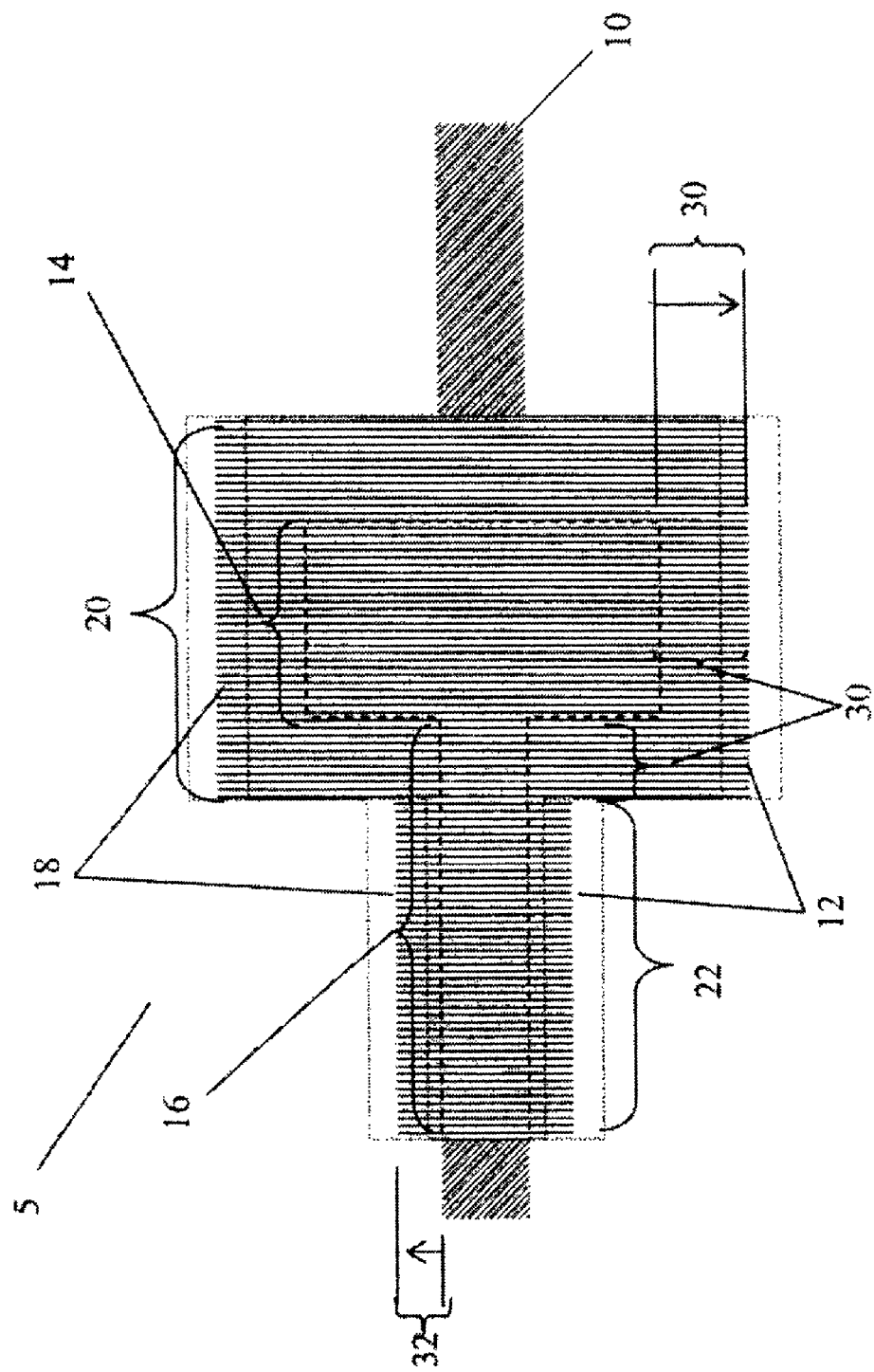
FIGS. 6-8 illustrates steps in an embodiment of forming a wide-image and loop-cutter pattern in accordance with the invention.

Referring to FIG. 6, the size and overlap of the follow-mask 18 over the hard mask loop 10 is shown. The target image shape 12 is shown having a wide section 14 and a narrow section 16. The narrow section 16 of the target shape 12 corresponds to the critical edges of the underlying hard mask loop 10. The follow-on mask 18 includes a wide section 20 and a narrow section 22. As indicated above, one purpose of the narrow section 22 of the follow-on mask 18 is to preserve the underlying section of hard mask 10 during the hard mask loop 10 cutting or etching process. Thus, the narrow section 22 of the follow-on mask 18 should extend beyond the edges of the hard mask loop 10 in order to protect those precision or critical edges.

The amount by which the follow-on mask 18 extends beyond the edges of the underlying hard mask loop 10 is the overlap 32. The amount by which the follow-on masks 18 extends beyond the edges of the wide section 14 of target image 12 is the extended section 30. Initially, the extended section 30 is generally larger than the overlap 32. The amount by which the target image 12 is extended to form the follow-on mask 18 should preferably be sufficient so that despite follow-on mask 18 registration and image size errors, substantially all critical edges of the underlying hard mask 10 material remain covered during the loop etching process to avoid degrading the wanted portions such as the precision edges of the hard mask 10. In other words, because preserving edges of the loop material maintains control of critical widths afforded by SIT processing, the amounts by which the original (designed) pattern of the follow-on mask is expanded (32, 30) have to be sufficient so that, despite follow-on mask registration and image size errors, all critical edges of that loop material remain covered during loop-cutting in order to prevent degrading line width control.

Figure 7:
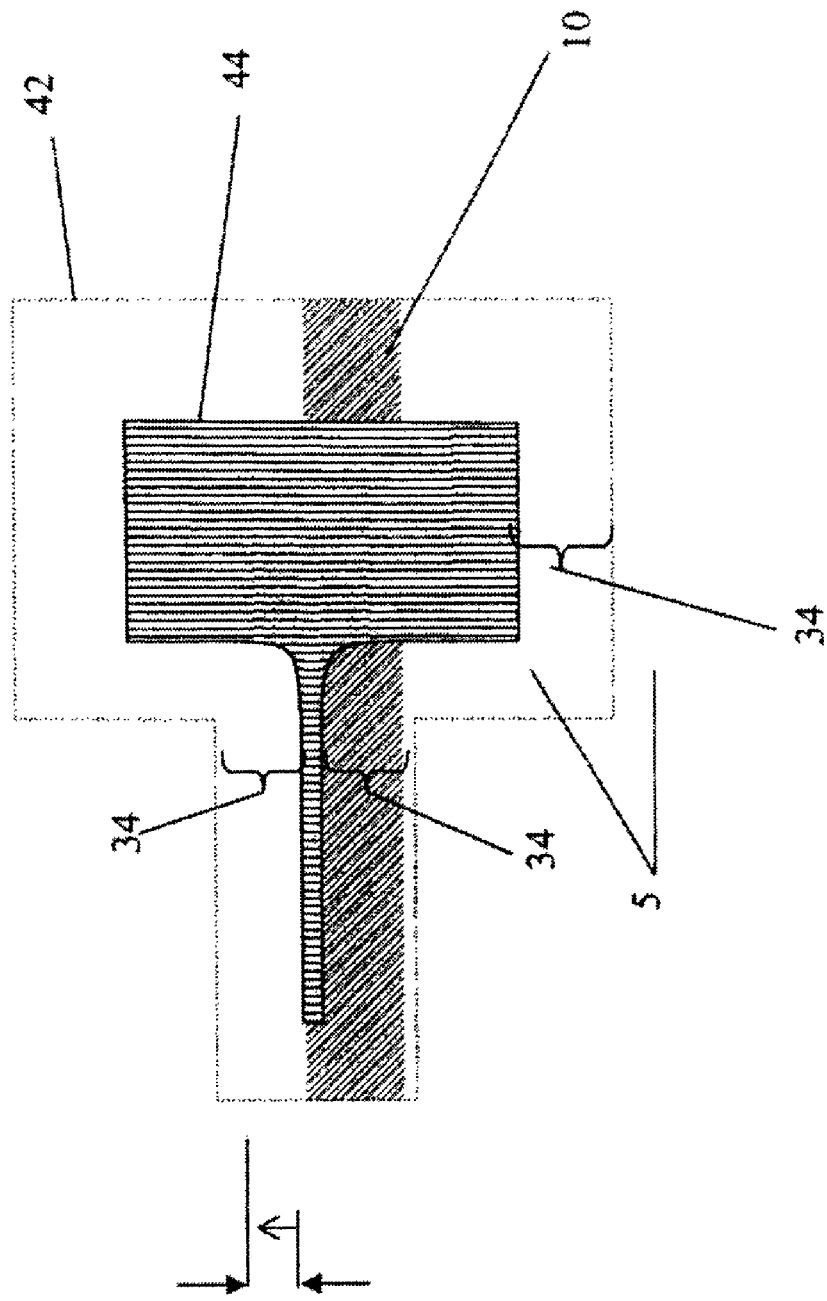

Referring to FIG. 7, an illustration of the effects of a mis-registered follow-on mask 18 is shown. In this example, the follow-on mask 44 has been formed in mis-alignment and pull-back etched. As illustrated, for this embodiment the amount of pull-back 34 need not remove the entire width of narrow section 22 as long as critical edges of hard-mask loop section 10 are exposed despite some amount of mis-alignment.

In many cases, the follow-on mask masking pattern over critical-$L_{eff}$ regions will be completely removed. Since pull-back 34 is greater than the pattern expanded amount, a different, larger extended section 30 for pads than for device lines overlap 32 is needed.

Figure 8:
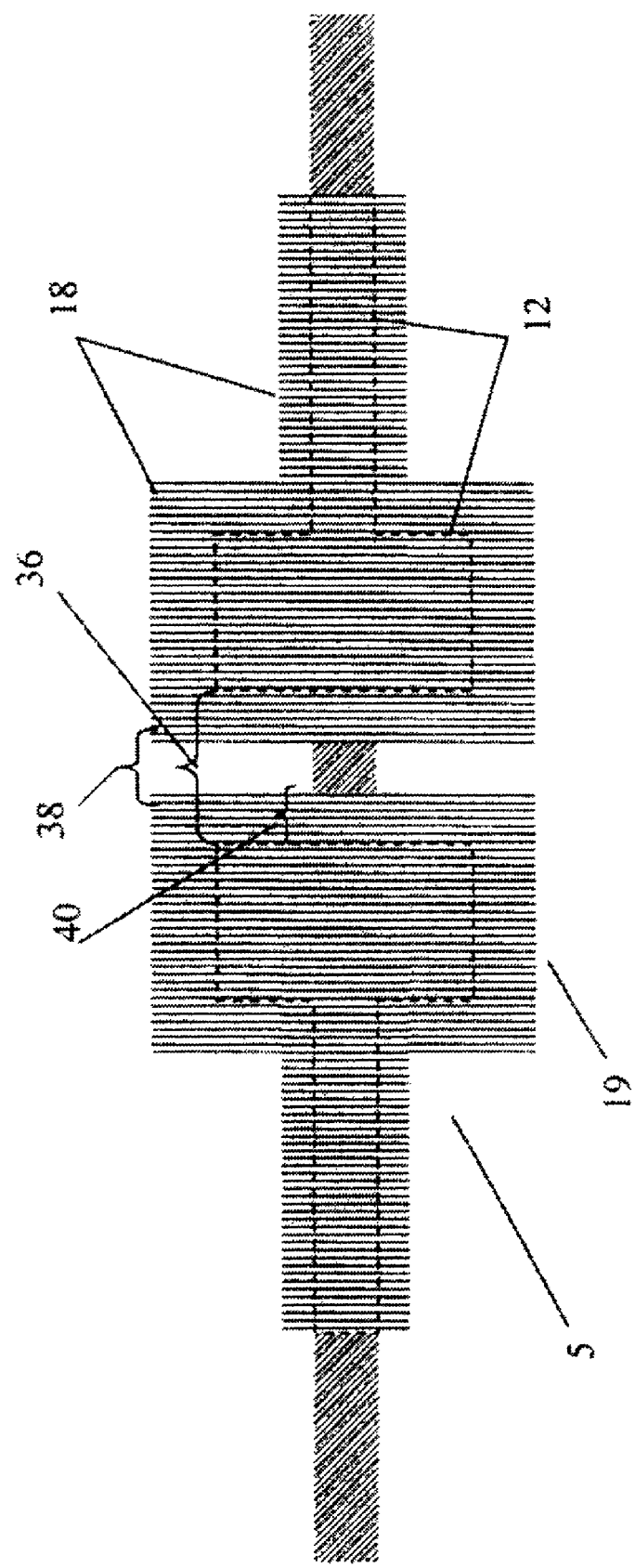

Referring to FIG. 8, an example of image pad density criteria for situations where multiple image pads are densely packed is shown. The minimum image pad space 36 density is related to the minimum lithographic pad-pad space 38 of two follow-on masks, 18 and 19, achievable with the method of the invention. Thus, the minimum image pad space 36 is related to the extended section 30 (FIG. 7). In other words, pad shapes on follow-on mask 18 should be sufficiently far apart to allow a minimum space to print between expanded adjacent pads.

Figure 9:
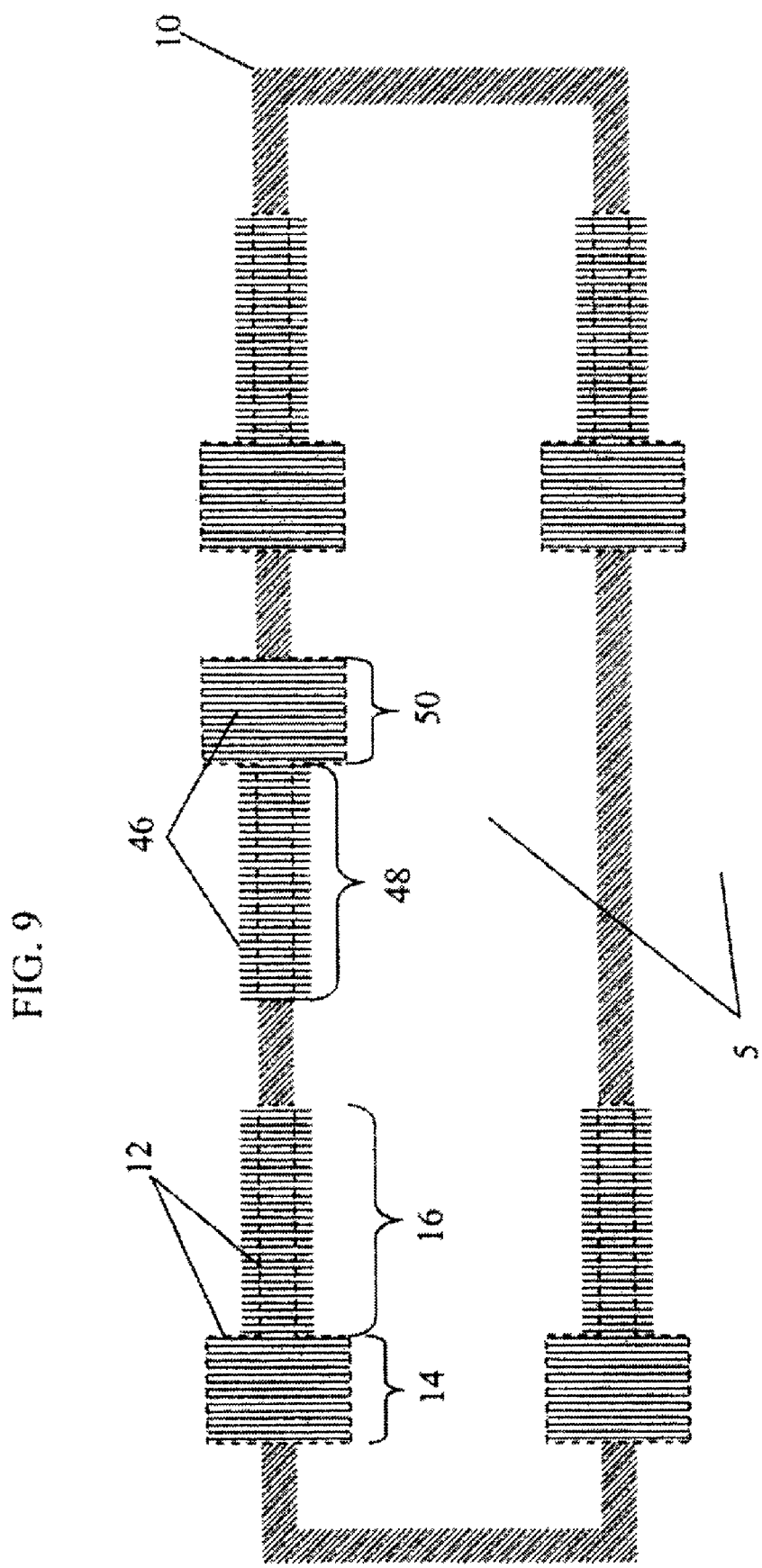
FIGS. 9-13 illustrates steps in an embodiment of forming a wide-image and loop-cutter pattern in accordance with the invention.

Referring to FIGS. 9-13, another embodiment of a combined wide-image and loop-cutter pattern is shown. Referring first to FIG. 9, in this embodiment, a hard mask loop 10 is formed on a substrate 5. An outline of the target shape 12 is shown by a dashed line. The target shape 12 has a wide section 14 and a narrow section 16. Also shown is the follow-on mask 46. Follow-on mask 46 has a narrow section 48 and a wide section 50, corresponding to the wide and narrow sections 14, 16, respectively, of the target shape 12.

The dimensions of the wide section 50 of the follow-on mask 46 approximately correspond to the dimensions of the wide section 14 of the target shape 12. Accordingly, the narrow section 48 of the follow-on mask 46 extends or overlaps beyond the edges of the underlying hard mask loop 10. The edges of the wide section 50 of the follow-on mask 46 also extend beyond the edges of the underlying hard mask loop 10 while still corresponding to the dimensions of the wide section 14 of the target shape 12. Additionally, an edge of the wide section 50 may be configured to coincide with edge of the hard mask loop 10. Thus, the wide section 50 of the follow-on mask 46 does not contain a section expanded beyond the underlying image shape 12. In other words, this embodiment is similar to the previously discussed embodiment, except that while critical-width line portions of designs are expanded to make the narrow sections 48 of follow-on mask 46, the follow-on mask pads 50 are not expanded.

Figure 10:
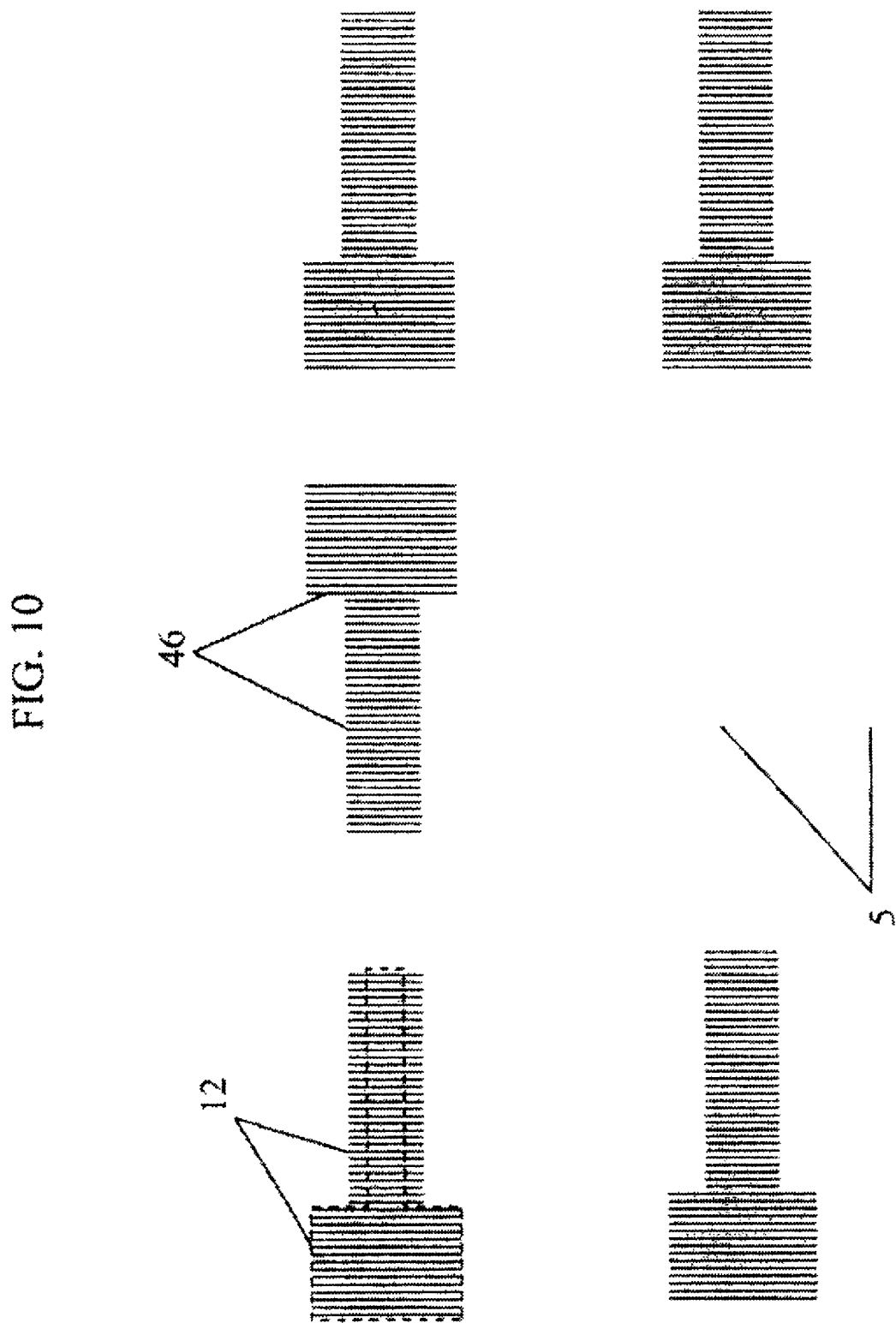

Referring to FIG. 10, the undesired exposed portions of the hard mask loop 10 are etched from the surface of the substrate 5. During this process, the follow-on mask 46 protects any hard mask loop 10 underlying the follow-on mask 46. Thus, the original hard mask loop 10 is formed into hard mask loop 10 sections, where each section corresponds to a follow-on mask 46.

Figure 11:
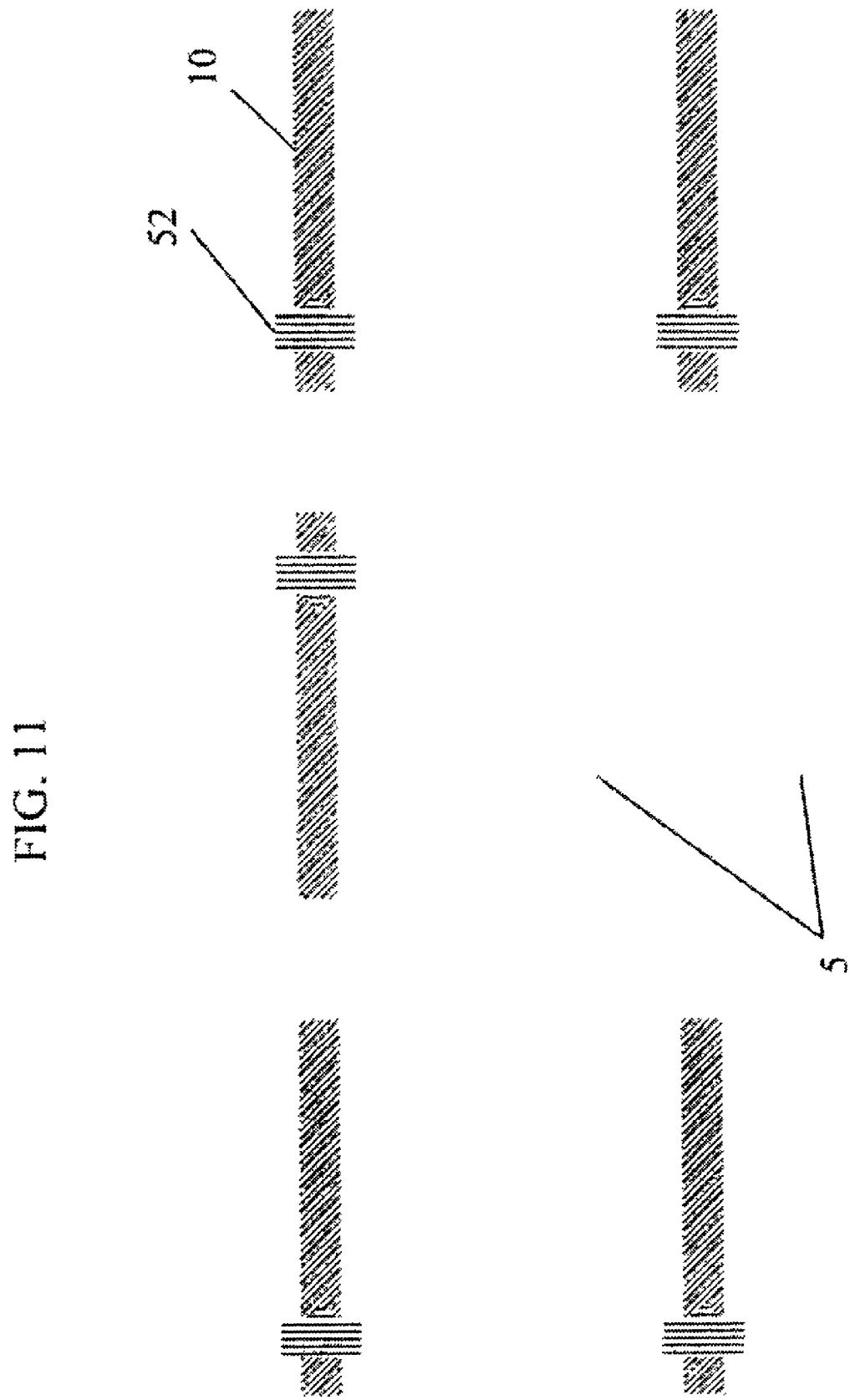

Referring to FIG. 11, after removal of unwanted portions of hard mask loop 10, the follow-on mask 46 has been pulled back to form a core pad 52. The narrow section 48 of the follow-on mask 46 has been etched away to expose the underlying hard loop mask 10, thus exposing the edges of the hard mask loop 10. The follow-on mask 46 may be pulled back by any of the methods well known in the art suitable for etching the material forming the follow-on mask 46, but which does not etch the hard mask loop 10 material. For example, a simple oxygen-based etch (ash) maybe used if the thickness of the follow-on mask 46 is sufficient.

Figure 12:
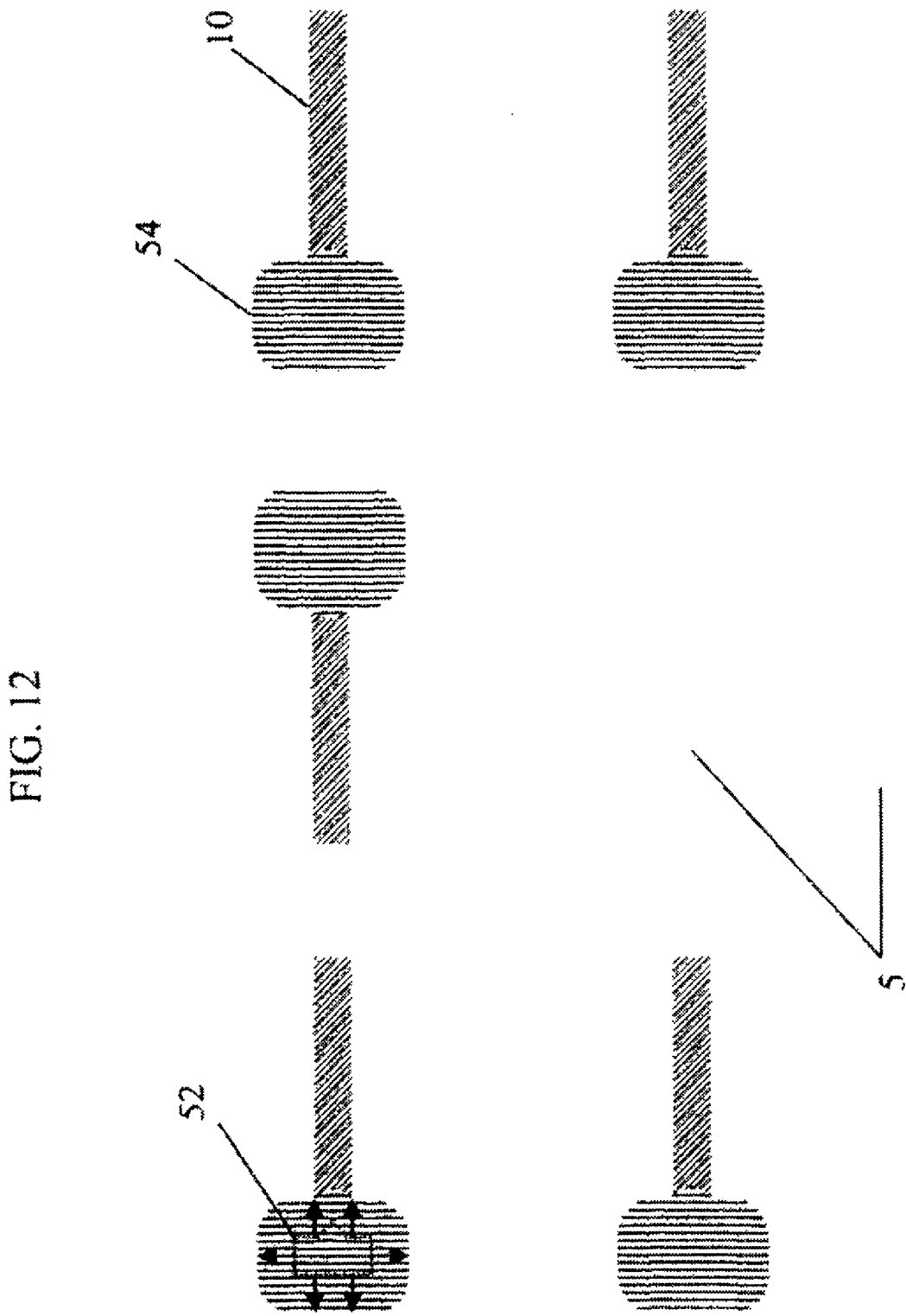

Referring to FIG. 12, the core pad 52 is then re-grown along its edges to expand its length and width to form an image pad 54. The image pad 54 is formed either over a section of hard mask loop 10 on top of the substrate 5 or over a core pad 52 employed for patterning shapes not attached directly to portions of the hard mask loop 10. The core pad 52 is then grown back to approximately its original size using a side wall deposition and directional-etch process. The directional-etch portion of this process should have sufficient over etch to remove deposited material from the sidewalls of hard mask loop 10, which thus must be thinner than the sidewall height of core pads 52.

It should be noted that re-growing the core pad 52 to form the image pad 54 does not reform the thin section 48 of the original follow-on mask 46 because there is no structure remaining on which to re-grow the narrow section 48. There is no structure remaining because pull-back completely removed narrow sections 48 of the follow-on mask 46.

Figure 13:
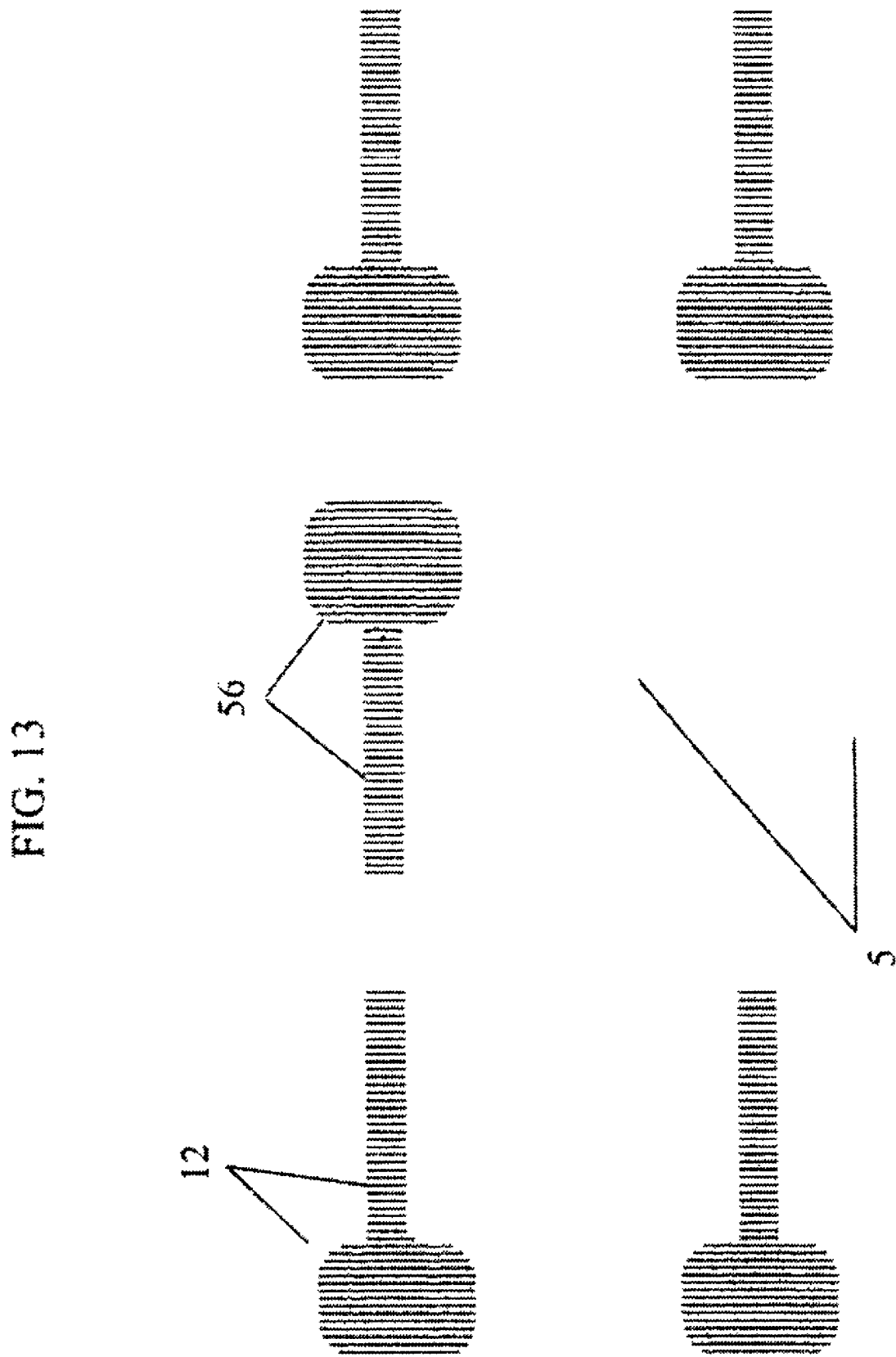

Referring to FIG. 13, after the image pad is grown, the combination (shown as reference numeral 56) of the image pad 54 and the remaining section of the hard loop mask 10 is used as a mask to etch the final shape into the underlying substrate 5. Once the substrate 5 has been etched, the image pad and section of hard mask loop 10 are removed. It should be noted that this method of combined wide-image and loop-cutter does not produce the stub 26 shown in FIG. 5. Additionally, the minimum pad-pad distance is decreased because the wide section 50 of the follow-on mask 46 does not need to extend beyond the edges of the target shape 12.

The above method allows multiple initial follow-on masks 46 to be placed close to one another. However, image pads cannot be made with dimensions less than twice the pull-back distance, and thus either the minimum image pad size is limited or the pull-back distance is limited, both of which place size limitations on the target shape. Additionally, minimum pad-to-pad distance is decreased, but this method may be less effective for making pads with dimensions less than twice the pull-back/regrow distance plus enough to keep the desired structures in place.

Figure 14:
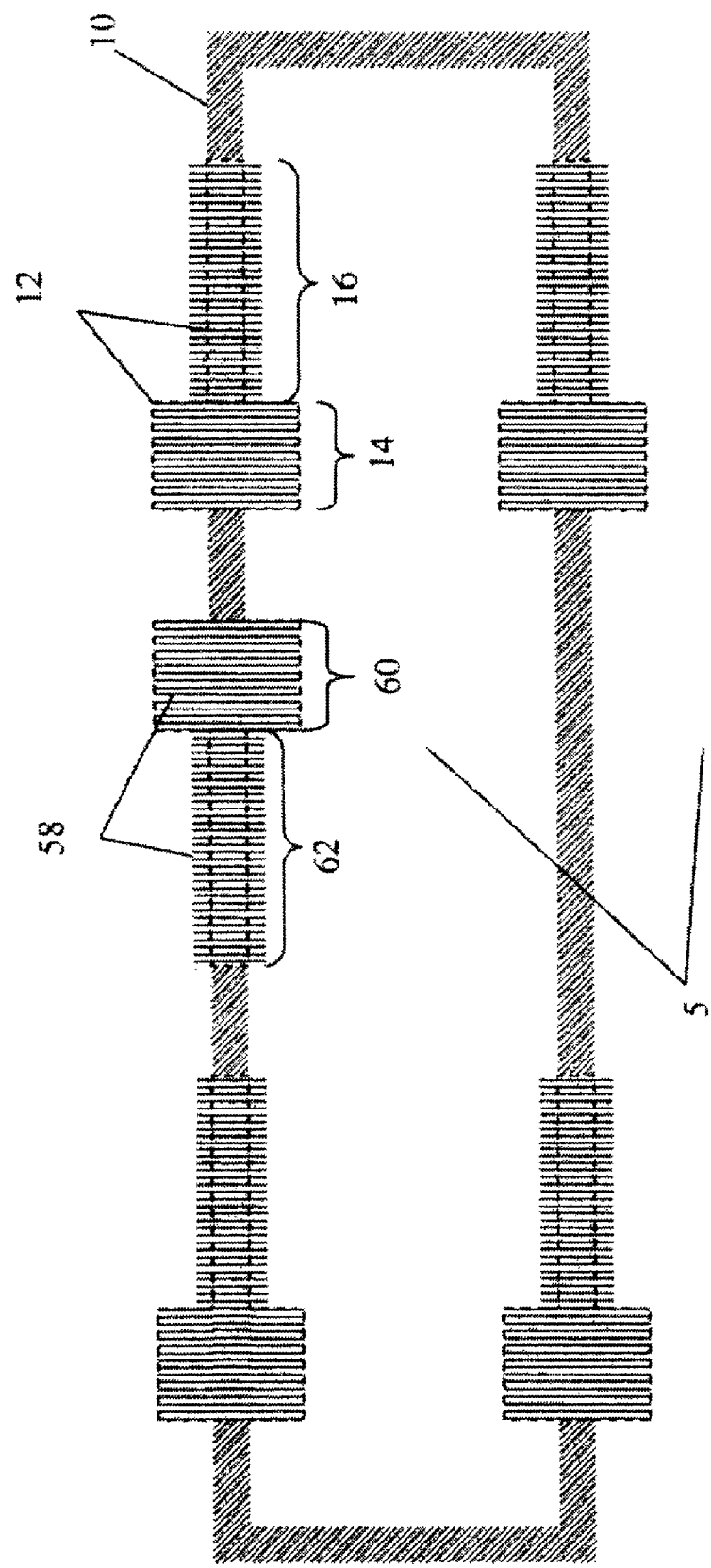
FIGS. 14-16 illustrates steps in an embodiment of forming a wide-image and loop-cutter pattern in accordance with the invention.
Figure 15:
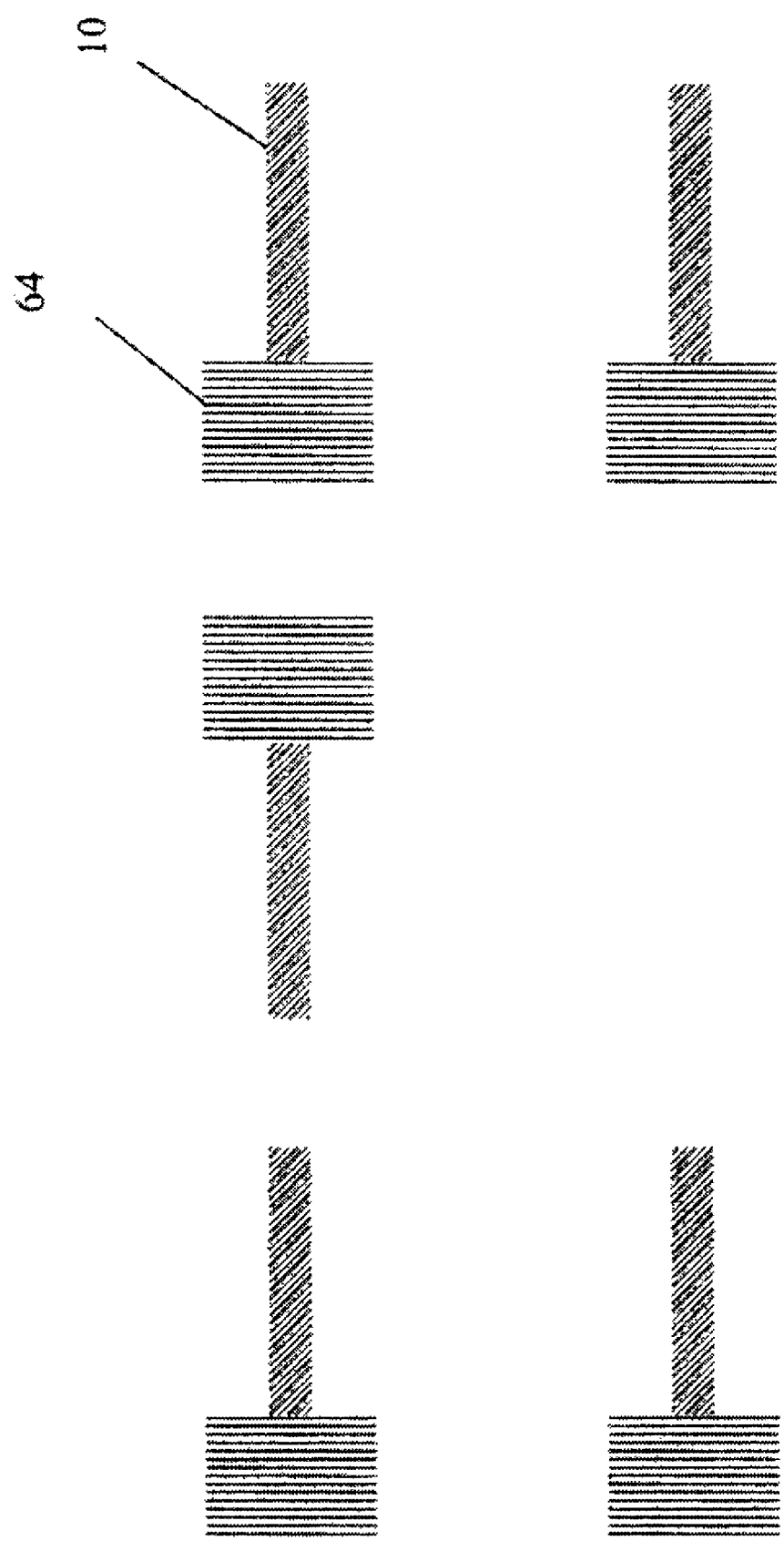
Figure 16:
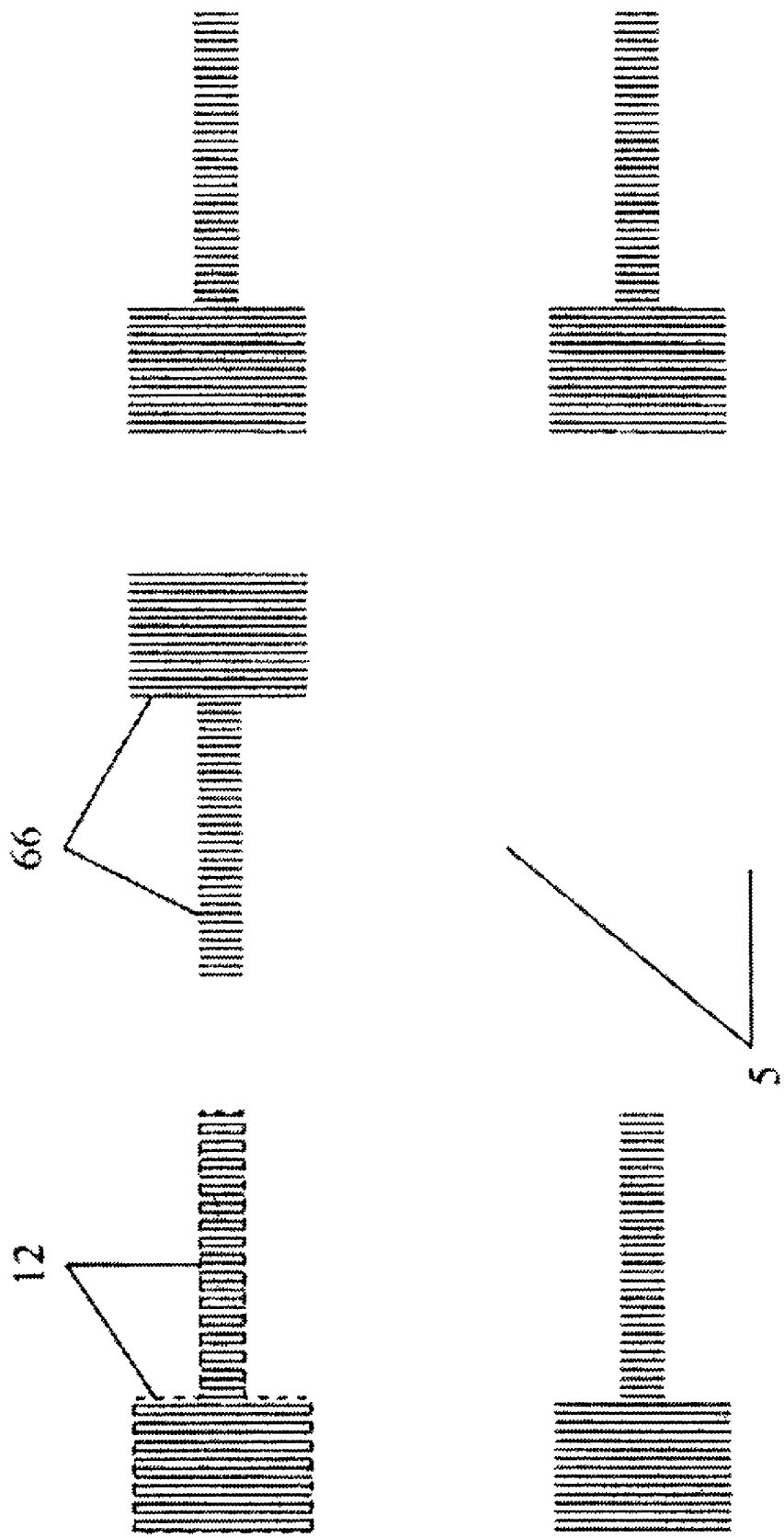

Referring to FIGS. 14-16, another embodiment of a wide-image and loop-cutter combination pattern is shown. Beginning with FIG. 14, a substrate 5 has a hard mask loop 10 formed on its surface. Formed over the hard mask loop 10 is a follow-on mask 58. The follow-on mask 58 includes a narrow region 62 and a wide region 60. A target shape 12 is indicated by the dashed lines. The target shape 12 has a wide area 14 and a narrow section 16.

The narrow section 62 of the follow-on mask 58 is formed at a reduced thickness as compared to the wide section 60 of the follow-on mask 58. The narrow section 62 of the follow-on mask 58 is typically about 25% thinner than the wide section 60 of the follow-on mask 58 although other differences in thickness are also contemplated. The narrow section 62 of the follow-on mask 58 may be formed at a reduced thickness by any of the methods well known in the art for forming a thinner mask. For example, the reduced thickness of mask 58 in narrow section 62 is formed by operating the imaging tool so that narrow section 62 is of a dimension approaching the resolution limits of the tool.

The follow-on mask 58 will generally rely on degradation of resist profiles when smaller lines are printed. Additionally, it is well known to those of skill in the art that using photolithography to print "properly out of focus" narrow lines can maintain good nominal line width control, but degrade in as-developed resist height. Thus, the thinned narrow section 62 of the follow-on mask 58 may be printed concurrently with the wide section 60 of the follow-on mask 58. Additionally, the narrow section 62 of the follow-on mask 58 overlaps, i.e., extends beyond the critical edges of the hard mask loop 10.

After the follow-on mask 58 is formed, the unwanted exposed portion of the hard mask loop 10 is etched or otherwise removed. Thus, the unwanted portions of the hard mask loop 10 are removed while the critical portions of the hard mask loop 10 are protected and remain intact under the follow-on mask 58. In other words, this embodiment uses a mask created from line and pad data very similar to that used for previously discussed embodiments. Also, critical SIT-defined regions have design expanded by an overlap amount so that critical edges of the hard mask loop 10 are protected despite overlay and image size variability.

Referring to FIG. 15, after the unwanted portions of the hard mask 10 are removed, the follow-on mask 58 is vertically etched. During the vertical etch process, the thin narrow section 62 (of FIG. 14) of the follow-on hard mask 58 is preferentially removed, while the thick wide section 60 (of FIG. 14) of the follow-on mask, while also being etched, will remain upon the completion of the vertical etch. Accordingly, the remaining structure includes an image pad 64 which corresponds to the original wide section 60 of the follow-on mask and an exposed section of the hard mask loop 10.

Together, the image pad 64 and the remaining section of the hard mask 10 form a mask corresponding to the target shape 12. Additionally, the critical edges of the section of the hard mask 10 are now exposed after having been protected during the hard mask etch step. In other words, vertically strip the follow-on mask 18 pattern so that the thinned areas are completely removed, but areas with full-height resist remain.

Referring to FIG. 16, the substrate 5 is etched using the combination of the image pad 64 and remaining section of the hard mask 10 as a mask to form the final shape 66 in the substrate 5. The final shape 66 corresponds to the target shape 12 and is formed by a combination of portions of the original follow-on mask 58 (shown in FIG. 14) and exposed portions of the hard mask 10.

In this embodiment, the minimum pad-to-pad distance is decreased over previously discussed embodiments. Also, it is possible to design pads with small dimensions as long as they are large enough so that they do not suffer resist thinning during follow-on mask 18 printing.

As should be now understood, in embodiments of the invention, methods include depositing on a section of the SIT loop an oversized follow-on mask of the final image, and etching the mask uniformly to leave a final large area image while removing those portions of the follow-on mask covering critical edges of the SIT loop. In general, those portions of the SIT loop having critical edges which will contribute to the final image are covered during the SIT loop cutting process. After SIT cutting, the edges are re-exposed for the final etch in order to take advantage of the high tolerances possible with SIT image forming methods.

While the invention has been described in terms of exemplary embodiments, those skilled in the art will recognize that the invention can be practiced with modifications and in the spirit and scope of the appended claims.

What is claimed is:

1. A method of semiconductor fabrication, comprising the steps of:
    forming a sidewall image transfer (SIT) loop on a substrate such that the SIT loop forms a hard mask having a width substantially equal to a critical width of a narrow section of a target shape, wherein the narrow section of the target shape corresponds to a pair of critical edges of the hard mask formed by the SIT loop;
    protecting the pair of critical edges of the hard mask on the substrate with a first portion of a follow-on mask, wherein a width of the first portion of the follow-on mask exceeds the critical width by an amount of overlap, and a width of a wide section of the follow-on mask exceeds a width of a wide section of the target shape;
    removing an exposed portion of the hard mask that is not covered by the follow-on mask; and
    exposing the pair of critical edges of the hard mask by etching the follow-on mask to reduce the width of the first portion of the follow-on mask to less than the critical width.

2. The method of claim 1, wherein the exposing the pair of critical edges of the hard mask comprises etching the first portion of the follow-on mask from a side of the first portion of the follow-on mask.

3. The method of claim 2, further comprising removing a section of a sidewall of the wide section of the follow-on mask and then replacing a portion of the removed section of the sidewall of the wide section of the follow-on mask.

4. The method of claim 3, further comprising replacing a portion of the removed section of the sidewall of the second portion of the follow-on mask so that the second portion of the follow-on mask substantially aligns with the wide section of the target shape.

5. The method of claim 1, further comprising sizing the first portion of the follow-on mask to protect the critical edges of the hard mask when the follow-on mask is mis-registered by less than a predetermined amount.

6. The method of claim 1, wherein the SIT loop is formed using a non-photolithographic imaging technique.

7. The method of claim 6, wherein the SIT loop is a few tens of nanometers wide.

8. The method of claim 1, further comprising:
    reducing a length and the width of the wide section of the follow-on mask to form a core pad that is smaller than the wide section of the target shape; and
    re-growing the follow-on mask along edges of the core pad to form an image pad that substantially conforms to the wide section of the target shape.

9. A method of semiconductor fabrication, comprising the steps of:
    forming a sidewall image transfer (SIT) loop on a substrate such that the SIT loop forms a hard mask, wherein a width of the hard mask substantially equals a width of a narrow section of a target shape, and wherein the narrow section of the target shape corresponds to a pair of critical edges of the hard mask formed by the SIT loop;
    forming a follow-up mask in a loop-cutter pattern on a portion of the hard mask, wherein the follow-on mask comprises a wide-image section having a width that exceeds a width of a wide section of the target shape and a narrow-image section having a width that exceeds the width of the hard mask;
    removing a portion of the hard mask left exposed by the follow-on mask; and
    removing at least a portion of the narrow-image section of the follow-on mask.

10. The method of claim 9, further comprising sizing the narrow-image section to cover a portion of the hard mask when the follow-on mask is mis-registered by less than a prescribed amount.

11. The method of claim 9, further comprising sizing the wide-image section of the follow-on mask to substantially align with a corresponding wide section of a final structure.

12. The method of claim 9, further comprising reducing the width of the narrow image section of the follow on mask to an amount less than the width of the hard mask by removing at least a portion of the narrow-image section of the follow-on mask by etching the narrow-image section of the follow-on mask from at least either a side or a top of the narrow-image section of the follow-on mask.

13. The method of claim 12, further comprising forming a re-shaped follow-on mask by re-depositing material onto the wide-image section of the follow-on mask to substantially align the re-shaped follow-on mask with a corresponding portion of a final shape.

14. The method of claim 9, further comprising removing at least a portion of the narrow-image section of the follow-on mask by etching the narrow-image section of the follow-on mask from both a side and a top of the narrow-image section of the follow-on mask.

15. The method of claim 9, further comprising:
    reducing a length and the width of the wide-image section of the follow-on mask to form a core pad that is smaller than the wide section of the target shape; and re-growing the follow-on mask along edges of the core pad to form an image pad that substantially conforms to the wide section of the target shape.

16. A method of combining a wide-image mask and loop-cutter mask, comprising the steps of:
    forming a sidewall image transfer (SIT) hard mask loop on a substrate, wherein a width of a narrow section of a target shape substantially equals a width of the hard mask loop, the narrow section of the target shape corresponds to a pair of critical edges of the SIT hard mask loop, and a width of a wide section of the target shape exceeds the width of the hard mask loop;
    forming a follow-on mask over a portion of the hard mask loop, wherein the follow-on mask includes a first section corresponding to the wide section of the target shape and a second section overlapping the narrow section of the target shape, and a width of the second section of the follow-on mask exceeds the width of the narrow section of the target shape;
    removing regions of the hard mask loop uncovered by the follow on mask;
    etching the second section of the follow-on mask to expose underlying edges of the hard mask loop;
    etching the first section of the follow-on mask to reduce its length and width to produce an image pad that substantially conforms to the wide section of the target shape; and
    etching the substrate uncovered by the remaining hard mask loop and image pad.

17. The method of claim 16, wherein the etching the second section of the follow-on mask to expose underlying edges of the hard mask loop comprises completely removing the second section of the follow-on mask from the narrow section of the hard mask loop.

18. The method of claim 17, wherein the SIT hard mask loop is formed using a non-photolithographic imaging technique.

19. The method of claim 18, wherein the SIT hard mask loop is a few tens of nanometers wide.

* * * * *